United States Patent [19]

Guo

[11] Patent Number: 4,910,711
[45] Date of Patent: Mar. 20, 1990

[54] BICMOS READ/WRITE CONTROL AND SENSING CIRCUIT

[75] Inventor: Tzen-Wen Guo, Milpitas, Calif.

[73] Assignee: Advanced Micro Devices, Inc., Sunnyvale, Calif.

[21] Appl. No.: 346,970

[22] Filed: May 3, 1989

[51] Int. Cl.⁴ .............................................. G11C 7/00
[52] U.S. Cl. ................................ 365/189.06; 365/208
[58] Field of Search ..................... 365/189.06, 207, 208

[56] References Cited
U.S. PATENT DOCUMENTS 4,785,427 11/1988 Young ............................. 365/189.06

Primary Examiner—James W. Moffitt
Attorney, Agent, or Firm—Davis Chin

[57] ABSTRACT

A bipolar/CMOS read/write control and sensing circuit is provided for use with MOS memory cells in which data can be written into and sensed in the memory cells at high speeds. The MOS memory cell is coupled with a word line and between first and second bit lines at corresponding first and second sense nodes. The control and sensing circuit includes a bit-line clamping network which is responsive to an output control signal for clamping the first and second bit lines during a read operation so as to present a low impedance thereby decreasing the read time and for unclamping of the first and second bit lines during a write operation so as to present a high impedance which reduces the write time.

19 Claims, 2 Drawing Sheets

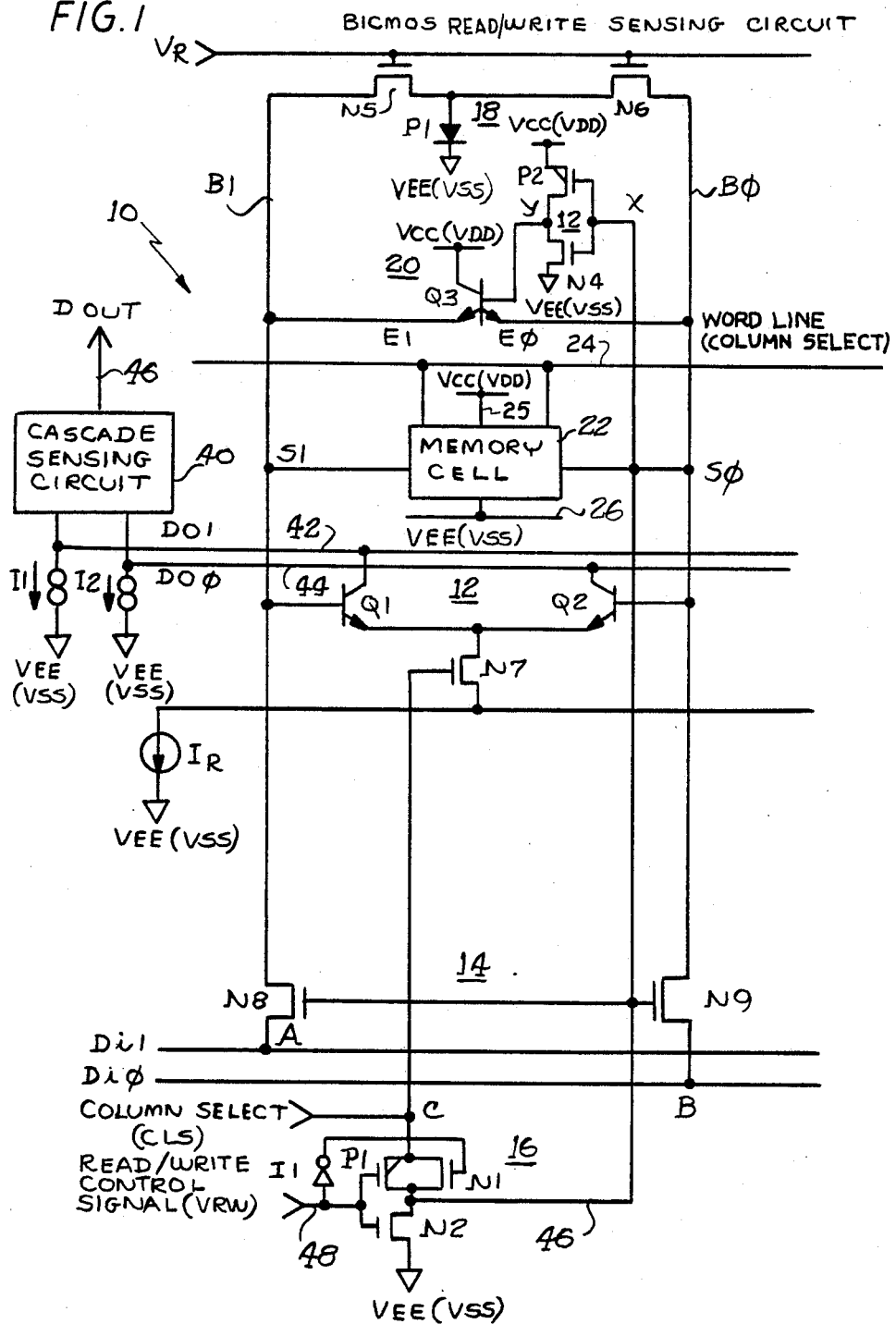
FIG.1 BICMOS READ/WRITE SENSING CIRCUIT

BICMOS READ/WRITE CONTROL AND SENSING CIRCUIT

BACKGROUND OF THE INVENTION

This invention relates generally to semiconductor memory devices and more particularly, it relates to a BICMOS (Bipolar/CMOS mixed type) read/write control and sensing circuit for MOS-type memory cells in which data can be written into and sensed in the memory cells at high speeds without reducing its stability.

Conventional read/write control and sensing circuits for MOS-type memory cells employing only MOS (metal-oxide semiconductor) transistors are generally well known in the art. Typically, a plurality of asymmetrical memory cells are arranged in an array forming columns of bits and rows of words where each memory cell is disposed for storing and retrieving binary information. Each memory cell may be comprised of a MOS cross-coupled latch and a pair of coupling transistors coupled between the latch and a pair of bit lines, which are used as a means for both writing information into the memory cell and sensing (reading) information from the memory cell.

Since the pair of bit lines are relatively long conductors which have coupled therebetween a number of memory cells, they represent a relatively large capacitive load. These MOS latches are ordinarily not capable of providing a high current so as to charge up or discharge rapidly the capacitive load of the bit lines. As a result, these prior art read/writes control and sensing circuits suffered from the disadvantages of increased write and read times to and from the memory cells.

It would therefore be desirable to provide a merged or composite bipolar/CMOS read/write control and sensing circuit which has the advantages of high writing speeds and high reading speeds. The read/write control and sensing circuit of the present invention is achieved by combining the bipolar transistor and CMOS transistor technologies together. As a result, bipolar transistors and CMOS transistors are merged or are arranged in a common semiconductor substrate in order to form an integrated circuit read/write control and sensing circuit of the present invention.

SUMMARY OF THE INVENTION

Accordingly, it is a general object of the present invention to provide a bipolar/CMOS read/write control and sensing circuit which is relatively simple and economical to manufacture and assemble, but yet overcomes the disadvantages of the prior art control and sensing circuits.

It is an object of the present invention to provide a bipolar/CMOS read/write control and sensing circuit for a memory cell in which data can be written into the memory cell at high speeds.

It is another object of the present invention to provide a bipolar/CMOS read/write control and sensing circuit for a memory cell in which data can be sensed from the memory cell at high speeds.

It is still another object of the present invention to provide a bipolar/CMOS read/write control and sensing circuit which includes a bit-line clamping network for clamping first and second bit lines during a read operation so as to present a low impedance thereby decreasing the read time and for unclamping of the first and second bit lines during a write operation so as to present a high impedance which reduces the write time.

In accordance with these aims and objectives, the present invention is concerned with the provision of a bipolar/CMOS read/write control and sensing circuit for use with a MOS memory cell in which data can be written into and sensed in the memory cell at high speeds which includes a MOS memory cell, a reading circuit, a writing circuit, a read/write control circuit, a bit-line current circuit, and a bit-line clamping network. The memory cell is coupled with a word line and between first and second bit lines at respective first and second sense nodes. The reading circuit is used to detect data signals stored in the memory cell at the first and second sense nodes and for amplifying the data signals to generate an output signal. The writing circuit is used to write data into the memory cell. The read/write control circuit is used to generate an output control signal so as to enable writing into the memory cell by the writing circuit. The bit-line current circuit is connected between the first and second bit lines and is used to provide current for the first and second bit lines. The bit-line clamping network is responsive to the output control signal for clamping of the first and second bit lines during the read operation so as to present a low impedance for a fast read and for unclamping of the first and second bit lines during the write operation so as to permit a high impedance for a fast write.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a schematic circuit diagram of a bipolar/CMOS read/write control and sensing circuit of the present invention;

DESCRIPTION OF THE PREFERRED EMBODIMENT

Figure 2A:
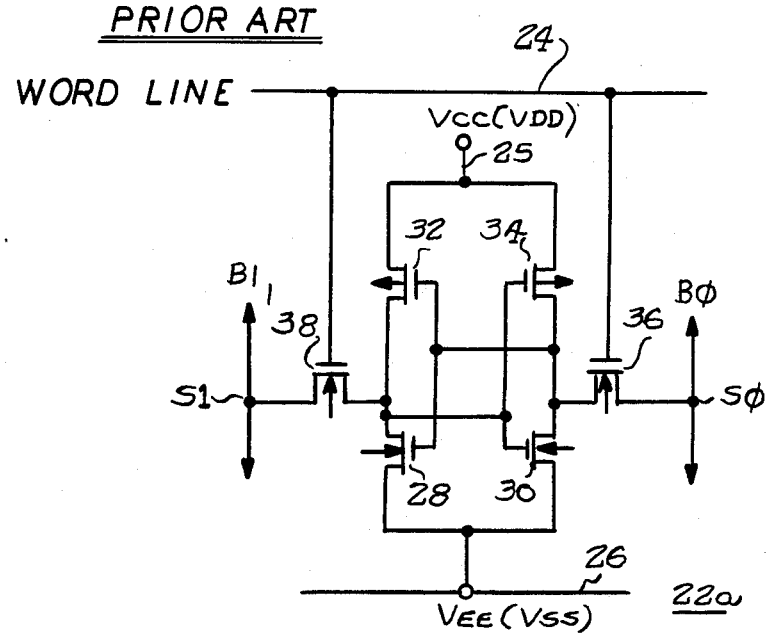
FIG. 2a is a schematic circuit diagram of a conventional MOS memory cell 22 of FIG. 1, which is referred to as a CMOS six transistor cell.

Referring now to FIG. 1 of the drawings, there is shown a schematic circuit diagram of a bipolar/CMOS read/write control and sensing circuit 10, which is comprised of a reading circuit 12, a writing circuit 14, a read/write control circuit 16, a bit-line current circuit 18, and a bit line bipolar clamping network 20, for both writing data into a memory cell 22 and sensing or reading data from the memory cell 22 at high speeds. The memory cell 22 is connected with a word line 24, an upper supply potential VCC(VDD) on line 25 and a lower supply potential VEE(VSS) on line 26. The memory cell 22 is also connected between a first bit line B$\phi$ at a sense node S$\phi$ and a second bit line B1 at a second sense node S1.

It should be understood that the memory cell 22 of FIG. 1 may be formed in a number of conventional ways known in the prior art. With reference to FIG. 2a, there is shown a schematic circuit diagram of one such conventional CMOS memory cell 22a of the prior art which consists of a standard cross-coupled latch and a pair of coupling transistors. The memory cell 22a is sometimes referred to as a CMOS six transistor cell. The cross-coupled latch is formed of a pair of N-channel MOS switching transistors 28 and 30 circuit and a pair of P-channel MOS transistors 32 and 34. The source electrodes of the transistors 32 and 34 are coupled together for connection to an upper supply potential VCC(VDD) on line 25. The gate electrodes of the transistors 28 and 32 are coupled together and to the drain electrodes of the transistors 30 and 34. The gate electrodes of the transistors 30 and 34 are coupled together and to the drain electrodes of the transistors 28 and 32. The source electrodes of the transistors 28 and 30 are coupled together for connection to a lower supply potential VEE(VSS) on line 26.

The pair of coupling transistors are formed of a first coupling transistor 36 and a second coupling transistor 38. The source-to-drain conduction path of the first coupling transistor 36 is connected between one side of the latch and the sense node S$\phi$. The source-to-drain conduction path of the second coupling transistor is connected between the other side of the latch and the sense node S1.

In operation, the memory cell 22 is normally in one of two stable states with either the gates of the transistors 28 and 32 being at a high logic level and the gates of the transistors 30 and 34 being at a low logic level or vice-versa. This memory cell is both read and written via the bit lines B$\phi$ and B1. During a read cycle, a voltage from a row select decoder (not shown) is applied to the positive word line 24 so as to turn on the coupling transistors 36 and 38 thereby coupling the cell to the bit lines B$\phi$ and B1. Since the bit lines B$\phi$ and B1 are relatively long conductors which are coupled to many other memory cells, they represent a relatively high load capacitance. Therefore, a relatively long time would be required generally for the CMOS cell itself to charge such capacitance and transfer the logic voltage level corresponding thereto to the bit lines B$\phi$ and B1, but for the present invention as will be presently explained.

Figure 2B:
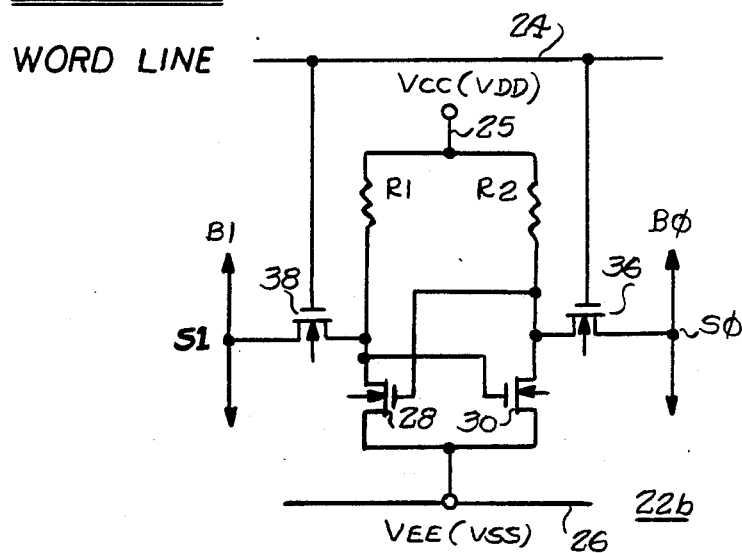
FIG. 2b is a schematic circuit diagram of another conventional MOS memory cell 22 of FIG. 1, which is referred to as a polyload four transistor cell.

With reference to FIG. 2b, there is shown a schematic circuit diagram of a conventional MOS memory cell 22b of the prior art. It will be noted that the memory cell 22b is identical to the memory cell 22a except that the pair of P-channel MOS transistors 32 and 34 have been replaced by resistors R1 and R2. The memory cell 22b is sometimes referred to as a polyload four transistor cell.

Referring again to FIG. 1, the reading circuit 12 comprises a bipolar differential pair of transistors Q1 and Q2, an N-channel MOS control transistor N7, a well-regulated current source $I_R$, a cascode sensing circuit 40, and two constant current sources I1 and I2. The transistor Q1 has its base connected to the bit line B1 and its collector connected to a first input of the sensing circuit 40 and to one end of the current source I1. The transistor Q2 has its base connected to the bit line B$\phi$ and its collector connected to a second input of the sensing circuit 40 and to one end of the current source I2. The other ends of the current sources I1 and I2 are connected to the lower supply potential VEE(VSS).

An amplified true output data signal DO1 corresponding to the data stored on one side of the memory cell is read on line 42, and an amplified complemented output data signal DO$\phi$ corresponding to the data stored on the other side of the memory cell is read on line 44. The gate of the control transistor N7 is connected to receive a column select signal CLS from a column select decoder (not shown). The source of the transistor N7 is connected to one end of the well-regulated current source $I_R$ and to other sources of transistors similar to the transistor N7 in other columns. The cascode sensing circuit 40 detects and further amplifies the amplified output data signals DO1 and DO$\phi$ on the respective lines 42 and 44 and generates an output data signal DOUT on line 46.

The writing circuit 14 includes a pair of separate coupling transistors N8 and N9 for coupling the respective bit lines B1 and B$\phi$ to the memory cell 22 during the write cycle. In particular, the source-to-drain conduction path electrodes of the coupling transistors N8 are coupled between the bit line B1 at the sense node S1 and a node A which receives a true write data input signal Di1. The source-to-drain conduction path electrodes of the coupling transistor N9 are coupled between the bit line B$\phi$ at the sense node S$\phi$ and a node B which receives a complemented write data input signal Di$\phi$. The gates of the coupling transistors N8 and N9 are connected together and are controlled by an output control signal on line 46 from the read/write control circuit 16.

The read/write control circuit 16 is formed of a CMOS inverter I1, a P-channel transistor P1, a first N-channel transistor N1, and a second N-channel transistor N2. The transistor P1 has its source connected to the drain of the transistor N1 and has its drain connected to the source of the transistor N1. The source of the transistor N1 is further connected to the drain of the transistor N2. The drain of the transistor N2 provides the output control signal on the line 46. The source of the transistor N2 is connected to the lower supply potential VEE(VSS). The source of the transistor P1 is further connected to receive the column select signal CLS via node C. The CMOS inverter I1 is formed of a P-channel MOS transistor and an N-channel MOS transistor. The inverter I1 has its input connected to receive a read/write control signal VRW on line 48 and its output connected to the gate of the transistor N1. The gates of the transistors P1 and N2 are connected together and receive also the read/write control signal VRW on the line 48.

The bit-line current circuit 18 includes a first biasing transistor N5, a second biasing transistor N6, and a limiting diode D1. The source-to-drain conduction path electrodes of the biasing transistors N5 and N6 are connected in series between the bit lines B$\phi$ and B1. The gates of the biasing transistors N5 and N6 are connected together and receive a well-regulated voltage source $V_R$ so that the bit-line current can be well controlled. The anode of the diode D1 is connected to the junction of the transistors N5 and N6, and the cathode of the diode D1 is connected to the lower supply potential VEE(VSS). The diode D1 is used to prevent a bit-line voltage appearing on the bit lines from being lower than a word-line voltage on the word line 24 during the write operation.

The bit-line bipolar clamping network 20 is comprised of a CMOS inverter I2 and a dual emitter bipolar clamping transistor Q3 of the NPN-type conductivity. The inverter I2 is formed of a P-channel MOS transistor P2 and an N-channel MOS transistor N4. The source of the transistor P2 is connected to the upper supply voltage or potential VCC(VDD). The gates of the transistors P2 and N4 are connected together defining the input of the inverter I2. The drains of the transistors P2 and N4 are connected together defining the output of the inverter I2. The source of the transistor N4 is connected to the lower supply potential VEE(VSS). The input of the inverter I2 is connected to the output control signal on the line 46, and the output of the inverter I2 is connected to the base of the clamping transistor Q3. The transistor Q3 has its collector connected also to the upper supply potential VCC(VDD), its one emitter Eφ connected to the bit line Bφ, and its other emitter E1 connected to the bit line B1.

Next, the operation of the bipolar/CMOS read/write control and sensing circuit 10 according to the embodiment of the present invention will be explained in detail. It is to be understood that in a memory device there would be additional bit line pairs, each coupled to other control and sensing circuits similar to that shown in FIG. 1, and that there would be additional memory cells coupled between the bit lines Bφ and B1 than the one shown in FIG. 1. It should be apparent to those skilled in the art that only the selected column will receive the sensing current from the current source $I_R$ and provides the data output signals DO1 and DOφ on the respective lines 42 and 44. When the memory cell 22 is selected by the column select signal CLS going to a high logic level, one side of the cell is ON and draws current from that side of the bit line. The other side of the cell is OFF. Initially, it will be assumed that the transistor 30 (FIG. 2a or 2b) is rendered conductive defining the ON side so that current flows through the bit line Bφ.

In the read cycle operation, the read/write control signal VRW is set to a high logic level. Thus, node X will be at a low logic level since the output control signal on the line 46 will be pulled to the lower supply potential due to the conduction of the transistor N2. As a result, the output of the inverter I2 at node Y will be at a high logic level. This causes the bipolar transistor Q3 to be rendered conductive and thus clamping strongly the bit lines Bφ and B1 so as to present a very low impedance. Consequently, the ON side cell current flowing through the transistor 30 and the bit-line biasing current flowing through the biasing transistor N6 (approximately 3 microamps) will be passed through the emitter Eφ of the transistor Q3. However, only the bit-line biasing current flowing through the biasing transistor N5 (approximately 3 microamps) will be passed through the emitter E1 of the transistor Q3.

The current signal is then converted by the bipolar transistor Q3 to a small voltage signal (approximately 50 millivolts) which can make fast switching on the bit lines so as to reduce substantially the read time of the memory cell 22. This small voltage signal on the bit line is subsequently amplified by the very sensitive pair of bipolar differential transistors Q1 and Q2. It will be noted that the coupling transistors N8 and N9 are turned off during the read cycle by the output control signal. Therefore, the circuit components connected to the nodes A and B are prevented from loading the bit lines Bφ and B1, thereby facilitating a reduced reading time.

In the write cycle operation, the case where the transistor 28 (FIG. 2a or 2b) in the memory cell is turned ON will now be explained. The read/write control signal is now set to a low logic level. Thus, the node X will be at the high logic level since the output control signal on the line 46 will be pulled to a high logic level due to the conduction of the transistors P1 and N1. As a result, the output of the inverter I2 at the node Y will be at a low logic level which removes the clamping on the bit line. The input data signals Di1 and Diφ will be passed through the coupling transistors N8 and N9 since they are turned on during the write cycle by the output control signal. If the data input signal Di1 is at a high logic level and the data input signal diφ is at a low logic level, the bit line B1 will also be high and the bit line Bφ will be low which cause the transistors 28 and 30 in the memory cell to be flipped or switch states.

After the write cycle, the read/write control signal VRW returns to the high logic level. Accordingly, the node X will go back to the low logic level and the node Y will go back to the high logic level. The bit lines are again quickly clamped by the bipolar transistor Q3. The bit lines Bφ and B1 are thus recovered quickly to the reading mode of operation. Now, the bit line B1 has the ON-side cell current flowing through the transistor 28 and the bit-line biasing current flowing through the biasing transistor N5. On the other hand, the bit line Bφ has only the bit-line biasing current flowing through the biasing transistor N6. As a result, the stored data in the memory cell 22 has been reversed.

As mentioned above, in the reading operation the clamping network 20 causes the bit-line loading to be very small so as to effect a fast read. Meanwhile, in the writing operation, the clamping network causes the bit-loading to have a very high or substantially infinite impedance by removing the clamp on the bit lines so as to effect a fast write. Accordingly, as explained above, the memory cell 22 can be both operated quickly in the reading operation and in the writing operation based upon this operational procedure.

From the foregoing detailed description, it can thus be seen that the present invention provides a bipolar/CMOS read/write control and sensing circuit for a CMOS memory cell in which data can be written into and sensed in the memory cell at high speeds without reducing its stability. The control and sensing circuit of the present invention includes a bit-line clamping network for clamping first and second bit lines during the read operation so as to present a low impedance for a fast read and for unclamping of the first and second bit lines during the write operation so as to present a high impedance for a fast write.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A bipolar/CMOS read/write control and sensing circuit for use with MOS memory cells in which data can be written into and sensed in the memory cells at high speeds, said read/write control and sensing circuit comprising in combination:

a MOS memory cell (22) being coupled with a word line and between first and second bit lines at corresponding first and second sense nodes;

reading circuit means for detecting data signals stored in said memory cell and for amplifying the data signals to generate an output signal;

said reading circuit means being formed of a bipolar differential pair of transistors (Q1, Q2), and an N-channel control transistor (N7), a well regulated current source ($I_R$), and a cascode sensing circuit (40);

one of said bipolar differential transistors (Q1) having its base connected to the first sense node and its emitter connected to the drain of said control transistor (N7), the other one of said bipolar differential transistors (Q2) having its base connected to the second sense node and its emitter connected to the drain of said control transistor (N7), the collectors of said bipolar differential transistors (Q1, Q2) being connected to said cascode sensing circuit (40), said control transistor (N7) having its gate connected to receive a column select signal, said current source ($I_R$) being connected between the source of said control transistor (N7) and a lower supply potential;

a writing circuit formed of first and second coupling transistors (N8, N9) each having source-to-drain conduction path electrodes and a gate, the source-to-drain electrodes of said first coupling transistor (N8) connecting a true data input signal to the first sense node, the source-to-drain electrodes of said second coupling transistor (N9) connecting a complemented data input signal to the second sense node;

read/writing control means for generating an output control signal which has a first logic state for activating the gates of said first and second coupling transistors (N8, N9) during a write operation and has a second logic state for deactivating the gates of said first and second coupling transistors (N8, N9) during a read operation;

bit-line current circuit means connected between said first and second bit lines for providing current on said first and second bit lines; and bit-line clamping means responsive to said output control signal for clamping of said first and second bit lines during the read operation so as to present a low impedance for a fast read and for unclamping of said first and second bit lines during the write operation so as to present a high impedance for a fast write.

2. A control and sensing circuit as claimed in claim 1, wherein said bit-line clamping means includes a CMOS inverter (I2) and a dual emitter bipolar transistor (Q3).

3. A control and sensing circuit as claimed in claim 2, wherein said inverter (I2) has an input and an output, and wherein said dual emitter bipolar transistor (Q3) has a base, a first emitter, and a second emitter, the input of said inverter (I2) being connected to receive the output control signal, said dual emitter bipolar transistor (Q3) having its base connected to the output of said inverter (I2) and its collector connected to an upper supply potential, said dual emitter bipolar transistor (Q3) having its first emitter connected to the first bit line and its second emitter connected to the second bit line.

4. A control and sensing circuit as claimed in claim 3, wherein said inverter (I2) is formed of a P-channel MOS transistor (P2) and an N-channel MOS transistor (N4).

5. A control and sensing circuit as claimed in claim 4, wherein said dual emitter bipolar transistor (Q3) is of an NPN-conductivity.

6. A control and sensing circuit as claimed in claim 1, wherein said bit-line current circuit means comprises a pair of N-channel biasing transistors (N5, N6) whose source-to-drain conduction path electrodes are connected in series and between said first and second bit lines, the gates of said biasing transistors (N5, N6) being connected to receive a well regulated voltage source ($V_R$).

7. A control and sensing circuit as claimed in claim 6, further comprising a limiting diode (D1) connected between the junction of said biasing transistors (N5, N6) and the lower supply potential to prevent a bit-line voltage from being lower than the word-line voltage during the write operation.

8. A control and sensing circuit as claimed in claim 1, wherein said read/write control circuit means is formed of a second CMOS inverter (I1), a P-channel transistor (P1), a first N-channel transistor (N1), and a second N-channel transistor (N2), said P-channel transistor (P2) having its source connected to the drain of said first N-channel transistor (N1) and its drain connected to the source of said first N-channel transistor (N1), the source of said first N-channel transistor (N1) being further connected to the drain of the second N-channel transistor (N2) to provide the output control signal, the source of the second N-channel transistor (N2) being connected to the lower supply potential, the source of the P-channel transistor (P1) being further connected to receive the column select signal, said second inverter (I1) having its input connected to receive a read/write control signal and its output connected to the gate of the first N-channel transistor (N1), the gates of the P-channel transistor (P1) and the second N-channel transistor (N2) being connected together and receiving also the read/write control signal.

9. A control and sensing circuit as claimed in claim 8, wherein said second CMOS inverter (I1) is formed of a P-channel MOS transistor and an N-channel MOS transistor.

10. A bipolar/CMOS read/write control and sensing circuit for use with MOS memory cells in which data can be written into and sensed in the memory cells at high speeds, said read/write control and sensing circuit comprising in combination:

a MOS memory cell (22) being coupled with a word line and between first and second bit lines at corresponding first and second sense nodes;

reading circuit means for detecting data signals stored in said memory cell and for amplifying the data signals to generate an output signal;

a writing circuit formed of first and second coupling transistors (N8, N9) each having source-to-drain conduction path electrodes and a gate, the source-to-drain electrodes of said first coupling transistor (N8) connecting a true data input signal to the first sense node, the source-to-drain electrodes of said second coupling transistor (N9) connecting a complemented data input signal to the second sense node;

read/writing control means for generating an output control signal which has a first logic state for activating the gates of said first and second coupling transistors (N8, N9) during a write operation and has a second logic state for deactivating the gates of said first and second coupling transistors (N8, N9) during a read operation;

bit-line current circuit means connected between said first and second bit lines for providing current on said first and second bit lines; and bit-line clamping means responsive to said output control signal for clamping of said first and second bit lines during the read operation so as to present a low impedance for a fast read and for unclamping of said first and second bit lines during the write operation so as to present a high impedance for a fast write.

11. A control and sensing circuit as claimed in claim 10, wherein said bit-line clamping means includes a CMOS inverter (I2) and a dual emitter bipolar transistor (Q3).

12. A control and sensing circuit as claimed in claim 11, wherein said inverter (I2) has an input and an output, and wherein said dual emitter bipolar transistor (Q3) has a base, a first emitter, and a second emitter, the input of said inverter (I2) being connected to receive the output control signal, said dual emitter bipolar transistor (Q3) having its base connected to the output of said inverter (I2) and its collector connected to an upper supply potential, said dual emitter bipolar transistor (Q3) having its first emitter connected to the first bit line and its second emitter connected to the second bit line.

13. A control and sensing circuit as claimed in claim 12, wherein said inverter (I2) is formed of a P-channel MOS transistor (P2) and an N-channel MOS transistor (N4).

14. A control and sensing circuit as claimed in claim 13, wherein said dual emitter bipolar transistor (Q3) is of an NPN-conductivity.

15. A control and sensing circuit as claimed in claim 10, wherein said bit-line current circuit means comprises a pair of N-channel biasing transistors (N5, N6) whose source-to-drain conduction path electrodes are connected in series and between said first and second bit lines, the gates of said biasing transistors (N5, N6) being connected to receive a well regulated voltage source ($V_R$).

16. A control and sensing circuit as claimed in claim 15, further comprising a limiting diode (D1) connected between the junction of said biasing transistors (N5, N6) and the lower supply potential to prevent a bit-line voltage from being lower than the word-line voltage during the write operation.

17. A control and sensing circuit as claimed in claim 10, wherein said read/write control circuit means is formed of a second CMOS inverter (I1), a P-channel transistor (P1), a first N-channel transistor (N1), and a second N-channel transistor (N2), said P-channel transistor (P2) having its source connected to the drain of said first N-channel transistor (N1) and its drain connected to the source of said first N-channel transistor (N1), the source of said first N-channel transistor (N1) being further connected to the drain of the second N-channel transistor (N2) to provide the output control signal, the source of the second N-channel transistor (N2) being connected to the ground potential, the source of the P-channel transistor (P1) being further connected to receive the column select signal, said second inverter (I1) having its output connected to receive a read/write control signal and its output connected to the gate of the first N-channel transistor (N1), the gates of the P-channel transistor (P1) and the second N-channel transistor (N2) being connected together and receiving also the read/write control signal.

18. A bipolar/CMOS read/write control and sensing circuit for use with CMOS memory cells in which data can be written into and sensed in the memory cells at high speeds, said read/write control and sensing circuit comprising in combination:

a MOS memory cell (22) being coupled with a word line and between first and second bit lines at corresponding first and second sense nodes;

bit-line clamping means responsive to an output control signal for clamping of said first and second bit lines during a read operation so as to present a low impedance for a fast read and for unclamping of said first and second bit lines during a write operation so as to present a high impedance for a fast write; and said bit-line clamping means being formed of a CMOS inverter (I2) and a dual emitter bipolar transistor (Q3).

19. A control and sensing circuit as claimed in claim 18, wherein said inverter (I2) has an input and an output, and wherein said dual emitter bipolar transistor (Q3) has a base, a first emitter, and a second emitter, the input of said inverter (I2) being connected to receive the output control signal, said dual emitter bipolar transistor (Q3) having its base connected to the output of said inverter (I2) and its collector connected to an upper supply potential, said dual emitter bipolar transistor (Q3) having its first emitter connected to the first bit line and its second emitter connected to the second bit line.

* * * * *